United States Patent [19]
Yamagishi et al.

[11] Patent Number: 5,015,838
[45] Date of Patent: May 14, 1991

[54] COLOR SENSOR HAVING LAMINATED SEMICONDUCTOR LAYERS

[75] Inventors: Hideo Yamagishi; Akihiko Hiroe; Hitoshi Nishio; Satoru Murakami; Keiko Miki, all of Kobe; Minori Yamaguchi, Akashi; Seishiro Mizukami; Yoshihisa Tawada, both of Kobe, all of Japan

[73] Assignee: Kanegafuchi Kagaku Kogyo Kabushiki Kaisha, Osaka, Japan

[21] Appl. No.: 294,625

[22] PCT Filed: Mar. 30, 1988

[86] PCT No.: PCT/JP88/00321
§ 371 Date: Jan. 27, 1989
§ 102(e) Date: Jan. 27, 1989

[87] PCT Pub. No.: WO88/07769
PCT Pub. Date: Oct. 6, 1988

[30] Foreign Application Priority Data
Mar. 31, 1987 [JP] Japan .................. 62-80548

[51] Int. Cl.$^5$ .............................. H01J 40/14
[52] U.S. Cl. .................... 250/211 J; 357/30
[58] Field of Search .......... 250/211 J, 226; 357/58, 357/30 K, 30 L, 2

[56] References Cited
U.S. PATENT DOCUMENTS

| | | | |
|---|---|---|---|
| 4,011,016 | 3/1977 | Layne et al. | 356/402 |
| 4,309,604 | 1/1982 | Yoshikawa et al. | 250/226 |
| 4,698,658 | 10/1987 | Sannomiya et al. | 357/30 |
| 4,714,950 | 12/1987 | Kawajiri et al. | 357/30 |
| 4,820,915 | 4/1989 | Hamakawa et al. | 250/211 J |

FOREIGN PATENT DOCUMENTS 3533146 3/1987 Fed. Rep. of Germany .
58-116781 10/1983 Japan .
59-27581 5/1984 Japan .

OTHER PUBLICATIONS

"An Amorphous SiC/Si Two-Color Detector", IEEE Electron Device Letters, vol. EDL 8, No. 8, New York, N.Y., Aug. 1987.
"The Amorphous SiC/Si Two and Three-Color Detector with High Rejection Ration", Technical Digest, International Electron Devices Meeting, Washington, D.C., Dec. 6-9, 1987.

*Primary Examiner*—David C. Nelms
*Attorney, Agent, or Firm*—Armstrong, Nikaido, Marmelstein, Kubovcik & Murray

[57] ABSTRACT

A color sensor of the present invention is a semiconductor element comprising a semiconductor wherein a plurality of pn or pin junctions are laminated, and conductive layers which are laminated on both surfaces of the semiconductor, characterized in that the semiconductor element is arranged in a way that the quantity of production of photocarriers is increased in order from the light incident side for the whole wave length band to be measured, and that value of current is detected by changing voltage between both conductivity layers. According to the color sensor of the present invention, the construction can be simplified, it is easily integrated and large-scaled, manufacturing process can be simplified, and the yield of color sensors increases, so that there can be realized a color sensor with low cost.

2 Claims, 2 Drawing Sheets

COLOR SENSOR HAVING LAMINATED SEMICONDUCTOR LAYERS

BACKGROUND OF THE INVENTION

1. Technical Field

The present invention relates to a color sensor, and more particularly a color sensor wherein the construction of the sensor is simple, and wherein the sensor is easily integrated and large-scaled.

2. Background Art

Hitherto, color sensors have been used in order to obtain information about the spectra of incident light.

Among color sensors, color sensors using multi-junction semiconductors are considered to be favorable since they can detect each spectrum of the incident light without distribution thereof by color filtering and the like. A color sensor like this generally has a construction as shown in FIG. 3. FIG. 3 shows a two-stage pin junction as an example. In FIG. 3, numeral 11 is a transparent electrode such as TCO, numeral 12 is the first stage pin junction. A transparent conductive film 14 is provided between the first stage pin junction 12 and the second pin junction 13. Numeral 15 is a back electrode provided on the side opposite to the incident light.

In an element shown in FIG. 3, the short wave light (blue light) has weak penetration ability, so that it results mainly in photoelectric current from the first stage pin junction, and the long wave light (red light) induces a photoelectric current in the first and the second stage pin junctions. If the thickness of the first stage pin junction is made thin enough, the red spectrum can be detected by detecting the photoelectric current from the second stage.

However, it is necessary in conventional oolor sensors comprising multi-junction semiconductors that three terminals are provided, and that a transparent conductive film is provided between both pin junctions. Therefore, if the number of stages is increased to three stages and four stages, it becomes necessary that four terminals and five terminals are provided respectively, and that two layers and three layers of transparent conductive films are provided respectively. Accordingly, conventional color sensors have drawbacks in that the construction thereof becomes complex when an integrated color sensor is made or when they are used as linear sensors. Complication of construction, as a matter of course, brings about complication in the manufacturing process and a commensurate increase of cost. Also, there is a problem that the yield of the color sensors decreases because of a short circuit being formed in a pin junction even if there are a few pin holes therein, since the electric potential of the transparent films provided between each pair of pin junctions is considered to be almost equal.

Taking into consideration the above-mentioned drawbacks, it is an object of the present invention to provide a color sensor wherein the construction of the sensor is simple, and it is easily integrated and large-scaled.

BRIEF DESCRIPTION OF THE INVENTION

The color sensor according to the present invention is a semiconductor element comprising a semiconductor, wherein a plurality of pn or pin junctions are laminated, and wherein conductive layers are laminated on both surfaces of the semiconductor, characterized in that the semiconductor element is arranged in such a way that the quantity of production of photocarriers is increased in order, from the light incident side for the whole wave length band to be measured, and that a value of current is detected by changing the voltage between both conductivity layers.

DETAILED DESCRIPTION OF THE PREFERRED EMBODIMENTS

Figure 1:
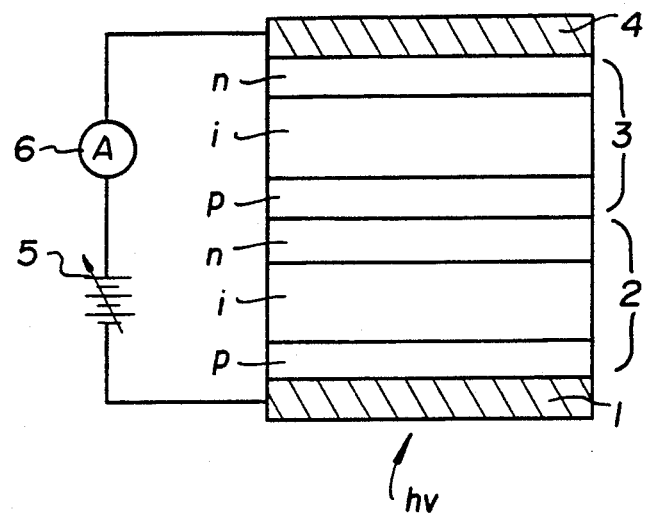
FIG. 1 is a schematic illustration of an embodiment of a color sensor of the present invention.

Referring now to the drawings, the color sensor of the present invention will be explained.

FIG. 1 is a schematic illustration of an embodiment of a color sensor of the present invention.

In FIG. 1, numeral 1 is a transparent electrode provided on the light incident side. Numerals 2 and 3 are the first stage pin junction and the second stage pin junction, respectively. Junctions 2 and 3 comprise semiconductor layers wherein the layers are laminated in a pin-pin order from the transparent electrode 1. A back electrode 4 is provided on an n-type layer of the second stage of the pin junction. Both the back electrode 4 and the transparent electrode 1 are conductors, and terminals are formed therewith. A circuit is formed between the back electrode 4, the transparent electrode 1, the terminals, a variable electric source 5 and an ammeter 6.

The material of the transparent electrode 1 can comprise oxide metal films such as ITO and $SnO_2$, thin metal films and films comprising a mixture thereof. The material of the back electrode can comprise metals such as Al, Cu and Ag, which can make a substantially ohmic contact with an adjacent semiconductor, however, the materials to be employed in the present invention are not limited to those discussed above.

As for the kinds of semiconductors comprising the semiconductor layers, any of amorphous semiconductors, amorphous semiconductors containing crystallite, and crystal semiconductors can be employed. Among them, it is preferable that amorphous semiconductors are employed, because semiconductors having good characteristics can be obtained by manufacturing processes, such as GD-CVD methods and photo-CVD methods which can form multijunction devices with low cost.

As for the type of semiconductor junction, either pn or pin junctions can be employed. There is no limitation as to the thickness of p-type layer, i-type layer and n-type layer, however, the standard thickness of amorphous silicon, for example, is in the range of 100 Å to 500 Å, 100 Å to 700 Å and 100Å to 500 Å respectively. Also, the semiconductor layers can be formed by sputtering methods, MBF methods and MOCVD methods, in addition to the above-mentioned GD-CVD and photo-CVD methods. Further, a part of the multi-junction is formed by normal ion implantation methods. In addition, the semiconductor layers are so constructed that the value of photoelectric current generated by the semiconductor layer at the light incident side is always at a maximum among the values of photoelectric currents for the whole wave length band to be used. Such a construction can be realized by ensuring that the thickness of the active layers, i.e. the i-type layers of all pin junctions are made equal, since the absorption coefficient of amorphous silicon in the visible light bands is larger for shorter wave lengths.

As amorphous semiconductors, alloys with elements such as C, N, Ge, Sn in addition to Si, i.e. a-SiC, A-SiN, A-SiSn, a-SiGe, A-SiCN and the like, and semiconductors containing crystallites thereof can be employed.

Next, there is explained the features of the color sensor shown in FIG. 1.

The fundamental feature of the color sensor is to detect the value of current with the ammeter 6, by applying a voltage between the transparent electrode 1 and the back electrode 4.

Figure 2:
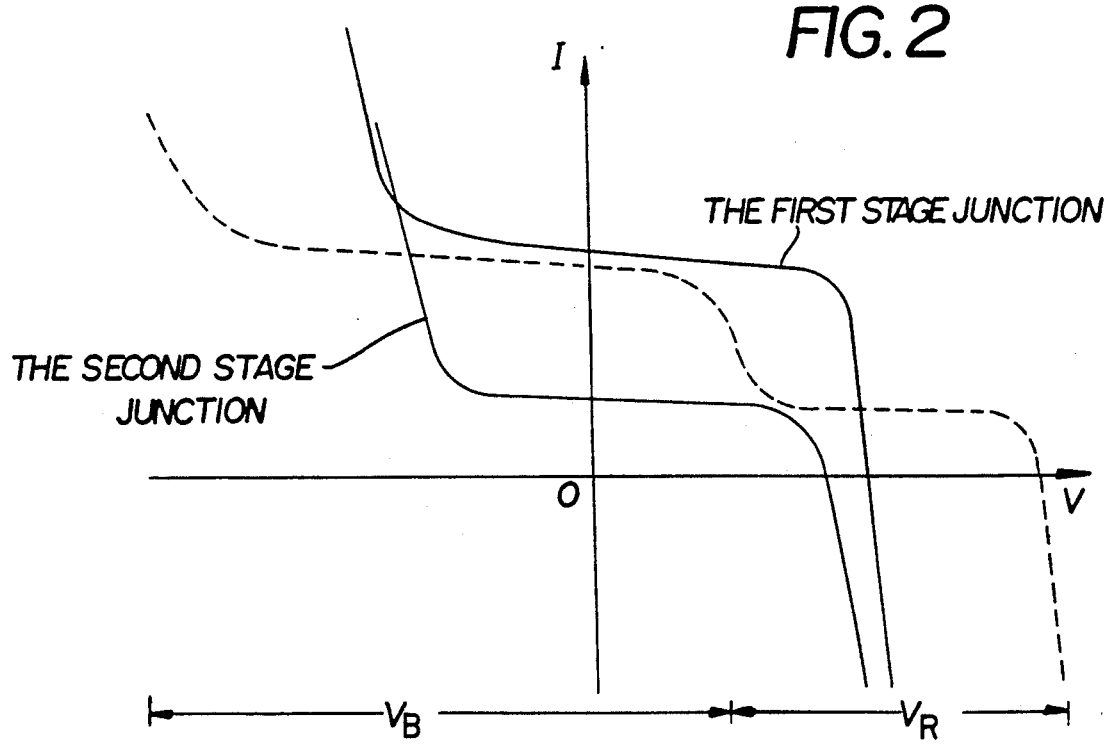
FIG. 2 is a graph showing a characteristic curve of the color sensor shown in FIG. 1.
Figure 3:
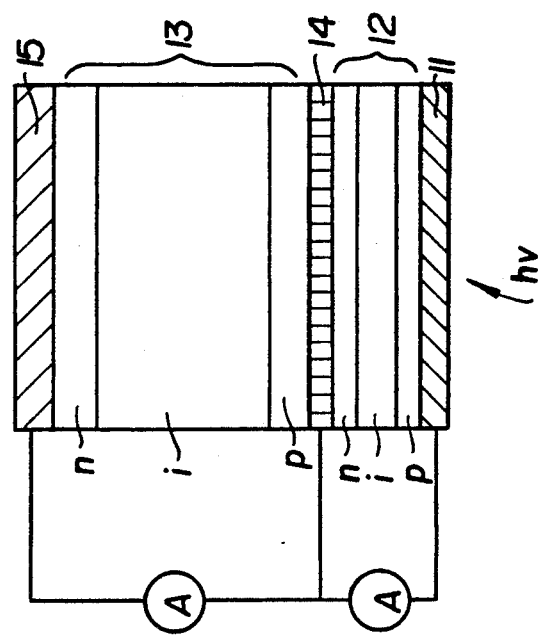
FIG. 3 is a schematic illustration of a conventional color sensor comprising a multi-junction semiconductor.

FIG. 2 shows characteristic curves of the element when a voltage is applied thereto. In FIG. 2, the solid line shows a characteristic curve of each stage. The color sensor functions so that the current in each stage is equal, as a whole, for the element, so that the characteristic curve becomes as shown by the dashed line. As shown in FIG. 2, there are two regions where the value of current is almost constant with respect to voltage. Also, when a color sensor has four stages, there are four regions where the value of current is almost constant with respect to voltage.

From FIG. 2, it can be understood that the value of current in the region of $V_R$ is almost equal to the value of Jsc of the second stage junction, so that the number of photo generating carriers can be estimated. And also, the number of photo generating carriers at the first stage junction can be estimated in the region of $V_B$ similarly. Accordingly, if a color sensor is designed to absorb mostly blue light at the first stage, only the red light spectrum contributes to the value of current in the region of $V_R$, so that when light having only a blue light spectrum, for example, is applied, the intensity of blue light can be estimated by amending the value of current in the region of $V_B$ with the value of current in the region of $V_R$.

Unless a semiconductor is so constructed, such that the photoelectric current of light on the incident side is always larger than those of other regions in the whole wave length band to be used beforehand, it cannot be determined which photoelectric current the values of current in the regions of $V_R$ and $V_B$ indicate. The regions of voltage such as $V_R$ and $V_B$ are determined by breakdown voltage. For amorphous semiconductors, the breakdown voltage is controlled with film thickness and film forming temperature.

As is described above, according to the color sensor of the present invention, the construction can be simplified, it is easily integrated and large-scaled, manufacturing processes can be simplified, and the yield of the color sensors increases, so that a color sensor with low cost can be realized.

What is claimed is:
1. A semiconductor sensor, comprising:
a back electrode;
a semiconductor element laminated on said back electrode, said semiconductor element including a plurality of pn or pin junctions laminated directly together and having a light incident face for receiving light, said semiconductor element is constructed such that a quantity of photocarriers is increasingly produced in adjacent junctions from said light incident face for a whole wavelength band to be measured when a voltage is supplied; and
a transparent front electrode laminated on said semiconductor element, said transparent front electrode forming a light incident face of said color sensor, wherein a value of current is detected by changing said voltage supplied between said back and transparent front electrodes.
2. The color sensor of claim 1, wherein one of said junctions is a pin junction comprising an amorphous semiconductor.

* * * * *